United States Patent
Graimann et al.

(10) Patent No.: US 6,207,494 B1
(45) Date of Patent: *Mar. 27, 2001

(54) ISOLATION COLLAR NITRIDE LINER FOR DRAM PROCESS IMPROVEMENT

(75) Inventors: Christoff Graimann, Villach (AT); Angelika Schulz, Ottendorf-Okrilla; Carlos A. Mazure, Munich, both of (DE); Christian Dieseldorff, Austin, TX (US)

(73) Assignee: Infineon Technologies Corporation, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/282,122

(22) Filed: Mar. 31, 1999

Related U.S. Application Data

(60) Continuation-in-part of application No. 08/726,442, filed on Oct. 4, 1996, now abandoned, which is a division of application No. 08/413,644, filed on Mar. 30, 1995, now abandoned, which is a continuation-in-part of application No. 08/715,289, filed on Sep. 16, 1996, now abandoned, which is a continuation of application No. 08/365,649, filed on Dec. 29, 1994, now Pat. No. 5,677,219.

(51) Int. Cl.$^7$ .............................................. H01L 21/8242
(52) U.S. Cl. ..................... 438/248; 438/243; 438/244; 438/245; 438/246; 438/247; 438/249; 438/386; 438/387; 438/388; 438/389; 438/390; 438/391; 438/392

(58) Field of Search .................................... 438/243, 244, 438/245, 246, 247, 248, 386, 387, 388, 389, 390, 391

(56) References Cited

U.S. PATENT DOCUMENTS

| | | | | |
|---|---|---|---|---|
| 4,649,625 | * | 3/1987 | Lu ........................................... | 29/571 |
| 5,182,224 | * | 1/1993 | Kim et al. ............................... | 437/52 |
| 5,309,008 | * | 5/1994 | Watanabe .............................. | 257/304 |
| 5,434,109 | * | 7/1995 | Geissler et al. ....................... | 437/239 |
| 5,521,114 | * | 5/1996 | Rajeevakumar ....................... | 437/60 |
| 5,658,816 | * | 8/1997 | Rajeevakumar ...................... | 438/386 |
| 5,677,219 | * | 10/1997 | Mazure et al. ......................... | 437/52 |

OTHER PUBLICATIONS

Wolf et al., "Chemical Vapor Deposition of Amorphous and Polycrystalline Films, Silicon Processing for the VLSI Era Volume–1 Process Technology," pp 191–194, 1986.*

* cited by examiner

Primary Examiner—John F. Niebling
Assistant Examiner—Jennifer M. Kennedy
(74) Attorney, Agent, or Firm—Stanton C. Braden

(57) ABSTRACT

A method of fabricating a trench cell capacitor can be used in the formation of a DRAM cell. In one embodiment, a trench is formed within a semiconductor substrate. The trench is lined with a dielectric layer, e.g., an ONO layer. After lining the trench, a collar is formed in an upper portion of the trench by forming an oxide layer in the upper portion. A nitride layer on the oxide layer. The trench is then filled with semiconductor material. For example, a semiconductor region can be epitaxially grown to fill the trench.

34 Claims, 12 Drawing Sheets

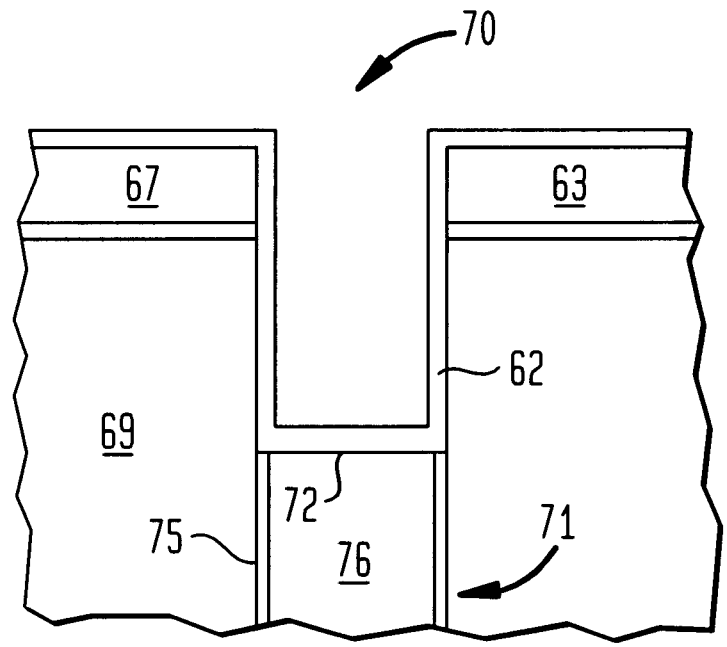
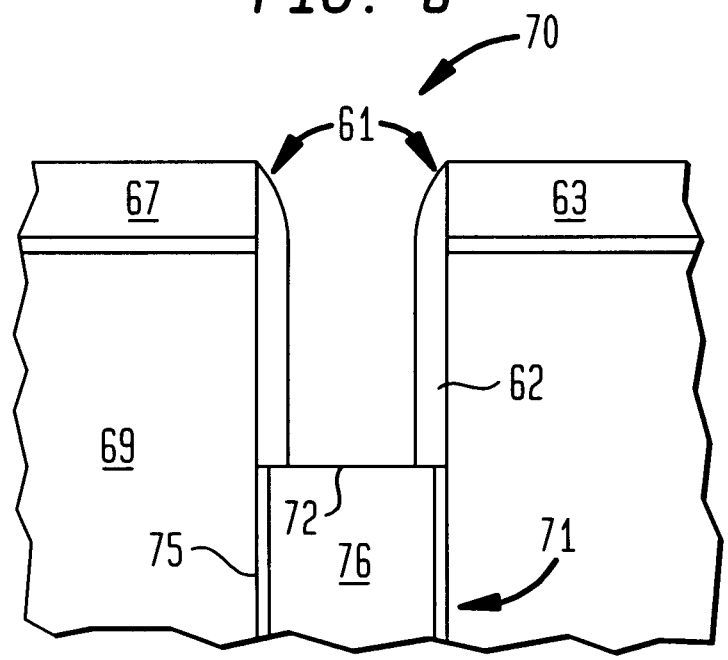

ISOLATION COLLAR NITRIDE LINER FOR DRAM PROCESS IMPROVEMENT

This is a continuation-in-part of application Ser. No. 08/726,442, filed Oct. 4, 1996 abandoned, which is a divisional of application Ser. No. 08/413,644, filed Mar. 30, 1995 abandoned, and is also a continuation-in-part of application Ser. No. 08/715,289, filed Sep. 16, 1996 abandoned, which is a continuation of application Ser. No. 08/365,649, filed Dec. 29, 1994, now U.S. Pat. No. 5,677,219.

FIELD OF THE INVENTION

The present invention relates generally to a trench capacitor and in particular, to an improved trench cell capacitor with an isolation collar that includes a nitride liner.

BACKGROUND OF THE INVENTION

Buried plated cell architecture for modern DRAMs (64 Mbit and higher) is one of the most promising concepts for improvements in memory technology. As is widely known, a DRAM cell is formed from a transistor and a capacitor. In a buried plate cell, a buried layer of a doped semiconductor material is formed in a substrate beneath the top source of the DRAM. This buried layer substantially forms one of the capacitor plates of the memory cell. The second capacitor plate is formed within a trench cell adjacent to the buried layer. The trench cell is filled with a doped semiconductor such as polysilicon which forms the second plate of the capacitor. The trench fill material is electrically isolated from the buried layer by means of a dielectric layer surrounding the trench.

An example of a prior art DRAM cell with a buried plate trench cell architecture is shown in FIG. 1. A p channel field effect transistor 15 includes an n+ drainwell 11, n+ source well 12 and p– channel region 13, which has gate 14 disposed thereon. Buried layer 16, here shown doped n+, is disposed within a p– doped substrate 17 beneath the active regions of transistor 15. A trench 31 filled with n+ doped polysilicon 54, 56 penetrates the buried layer 16. A thin dielectric layer 19, typically an oxide layer, surrounds the trench 31 in order to electrically isolate the trench-fill n+ material from the buried layer region 16. In this manner, a trench capacitor 27 is formed in which the n+ polysilicon within trench 31 forms one plate of capacitor 27. Note that buried region 16 has a portion adjacent to the trench region 31. Channel region 13 also has a portion which is adjacent to trench region 31. These adjacent portions of buried region 16 and channel region 13 form the other plate of trench capacitor 27. Dielectric layer 19 thus separates the two plates of trench capacitor 27. The drain well 11 is electrically connected to the trench cell 31 via trench electrode 41. Logic level voltages are thus transferred from the transistor 15 to the trench capacitor 27 which stores the voltage data.

From the structure of FIG. 1, one can ascertain that a vertical parasitic transistor 18 is created between the buried layer 16 and the drain well 11. N+ buried layer 16 acts as the source, p– region 13 acts like the channel region, and n+ well 11 acts as the drain of the parasitic transistor 18. Doped polysilicon 56 acts as the gate, and isolation collar 51 acts as the insulator between the gate and the channel of parasitic transistor 18. The parasitic device 18 must be kept turned off when the trench electrode 41 is at a high logic level voltage. This is accomplished by conveniently forming the isolation collar 51 as a thick oxide or the like, and having it extend down the trench 31 to substantially isolate the adjoining portion of channel region 13 from the doped polysilicon 56.

In a typical trench cell process, the trench 31 is first filled with doped semiconductor material 54 up until a predetermined level near the bottom of the isolation collar 51. This level is indicated by the cross-sectional depth line 29 in FIG. 1. After the first fill, the isolation collar 51 is formed, which may be a thick oxide layer such as tetra-ethyl-ortho-silicate (TEOS). The trench 31 is then filled with another "plug" 56 of the same doped semiconductor material from line 29 to the top surface. Thus, in order to incorporate the benefits of a thick isolation collar, two "plugs" of n+ polysilicon or similar material are needed to fill the trench 31.

Other examples of prior art DRAM trench cells which have isolation collars are described in U.S. Pat. No. 4,794,434 entitled "Trench Cell for a DRAM", issued on Dec. 27, 1985 to P. Pefley III. This patent discloses trench cells filled with either n+ or p+ polysilicon and describes a technique for raising the potential of the buried layer in order to reduce the maximum voltage which will be developed across the insulating layer.

The oxide isolation collar technique, while affording a number of advantages, suffers from several drawbacks in the course of subsequent processing. One problem is that subsequent high temperature steps will diffuse oxygen through top layers and eventually through the collar. This will lead to trench sidewall silicon oxidation and to poly oxidation, i.e., "trench poly-fill". The oxygen diffusion results in volume expansion which in turn can lead to the introduction of stacking faults and dislocations through stress generation.

Another problem is that contaminants outdiffusing from a TEOS collar may contribute to interface problems between the two semiconductor fill layers within the trench. This can lead to severe contact problems of the trench electrode. An additional problem is that outdiffusion of dopants from the highly doped trench polysilicon fill through the collar is possible in the case of disrupted or otherwise damaged collars.

Accordingly, it is an object of the present invention to provide an improved trench cell capacitor for a DRAM which overcomes the problems of the prior art.

It is a further object of the instant invention to provide an improved isolation collar of a DRAM trench cell capacitor which has a nitride liner for avoiding the problems associated with prior art isolation collars.

It is yet another advantage of the present invention to provide improved processes for forming an isolation collar in a DRAM trench cell.

These and other objects and advantages of the instant invention will become apparent to those of ordinary skill in the art having reference to the following detailed description of an exemplary embodiment thereof.

SUMMARY OF THE INVENTION

The instant invention is an improved trench cell capacitor within a semiconductor body, suitable for use in a 64 KB DRAM memory cell or in other similar memory cells. The improved trench cell capacitor includes a trench cell with doped semiconductor material disposed therein, an oxide isolation collar of a predetermined thickness surrounding the doped semiconductor material, and a nitride layer disposed between the oxide isolation collar and the doped semiconductor material. The nitride layer has a thickness less than the predetermined thickness of the isolation collar.

The inclusion of the nitride layer between the isolation collar and the doped material solves a number of processing problems associated with prior art trench cell capacitors having isolation collars.

Optionally, the improved trench cell capacitor may have a second oxide layer disposed between the nitride layer and the doped semiconductor material.

The trench cell of the capacitor may have a first region and a second region, with the isolation collar and the nitride layer being situated within the first region, and the doped semiconductor material being disposed in both of the first and second regions. A dielectric insulating layer having a thickness less than the predetermined thickness of the isolation collar surrounds the doped semiconductor material within the second region and also forms a bottom of the trench cell. The trench capacitor preferably has a buried layer of doped semiconductor material adjacent to the trench cell to substantially form one plate of the trench capacitor, wherein the doped semiconductor material disposed within the first and second regions of the trench cell forms a second plate of the capacitor, and the dielectric layer separates the plates of the capacitor.

The present invention also teaches a method of fabricating an improved trench cell capacitor within a semiconductor body. The method comprises the steps of: forming a trench within a semiconductor substrate; depositing an oxide layer of a predetermined thickness on exposed walls within the trench and on an exposed major surface within the trench; depositing a nitride layer over exposed portions of the oxide layer, where the nitride layer has a thickness less than the predetermined thickness; etching away a portion of the nitride layer and of the oxide layer covering the major surface to expose a portion of the major surface and filling the trench with doped semiconductor material to substantially fill the trench.

This method may further include the steps of: lining a portion of the trench with a dielectric layer of a given thickness after the trench is formed within the semiconductor substrate, where the given thickness is less than the predetermined thickness; filling the trench to a predetermined level with doped semiconductor material to substantially form the major surface at the predetermined level, the major surface thereby including exposed doped semiconductor material.

The present invention also teaches a method of fabricating a trench cell capacitor within a semiconductor body, comprising the steps of: forming a trench within a semiconductor body; depositing an oxide layer of a predetermined thickness on exposed walls within the trench and on an exposed major surface within the trench; etching away a portion of the oxide layer covering the major surface to expose a portion of the major surface; depositing a nitride layer over exposed portions of the oxide layer and on the exposed portion of the major surface; etching away a portion of the nitride layer covering the major surface to again expose a portion of the major surface; and filling the trench with doped semiconductor material to substantially fill the trench.

BRIEF DESCRIPTION OF THE DRAWINGS

For a better understanding of the instant invention, reference is made to the following description of an exemplary embodiment thereof, considered in conjunction with the accompanying drawings, in which:

FIGS. 5–8 illustrate an alternate sequence of process steps in the manufacture of a memory cell according to the present invention.

FIGS. 1–8 correspond to FIGS. 1–8 of parent application Ser. No. 08/726,442 and FIGS. 9–15 correspond to FIGS. 1–7 of parent application Ser. No. 08/715,289.

DETAILED DESCRIPTION OF THE INVENTION

This patent is a continuation-in-part of two patent applications, Ser. No. 08/726,442 and Ser. No. 08/715,289. Both of these parent applications are incorporated herein by reference as if reproduced in their entirety.

Figure 1:
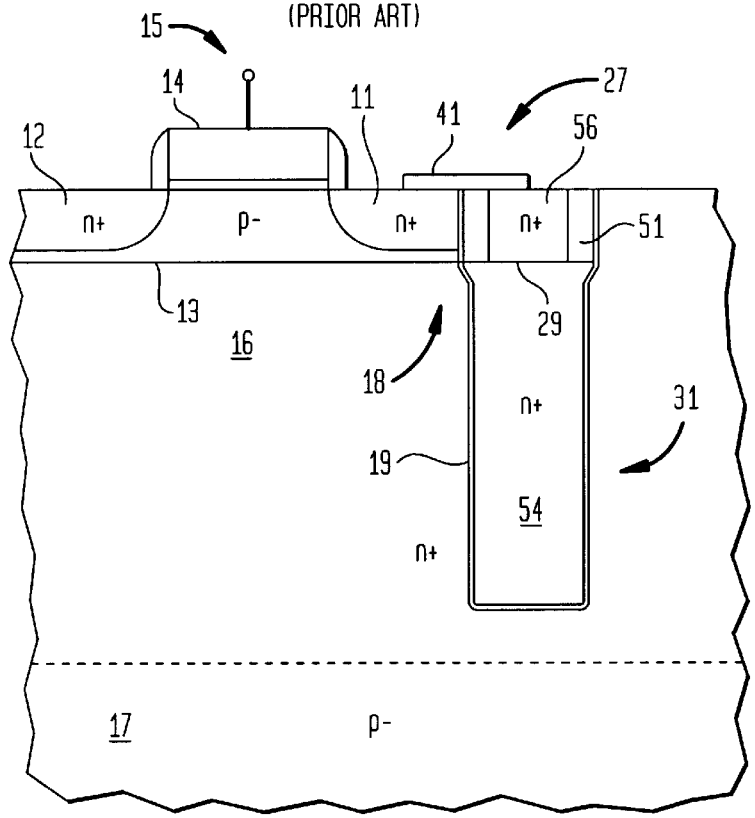
FIG. 1 shows a cross section of a trench cell capacitor type DRAM memory cell of the prior art.
Figure 2:
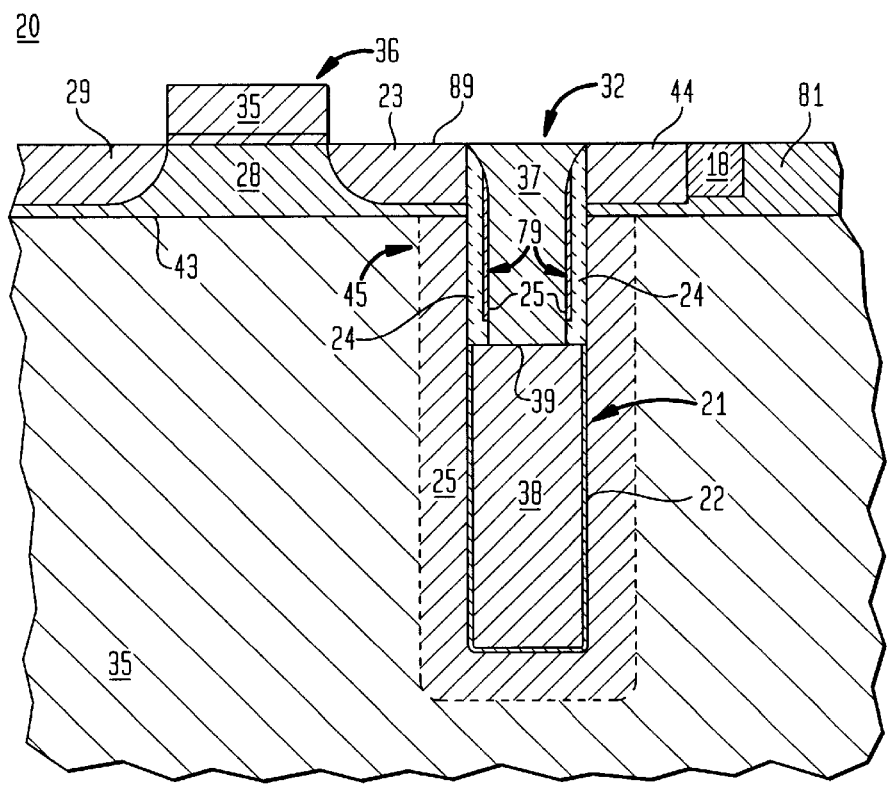
FIG. 2 shows a cross section of an exemplary embodiment of a trench cell capacitor type memory cell according to the present invention.

A preferred embodiment of an improved DRAM according to the instant invention is shown in cross section in FIG. 2. A DRAM 20 includes a transistor 36 and a trench capacitor 32 coupled to transistor 36, for storing data. Trench capacitor 32 includes a trench cell 21 which has a thick oxide isolation collar 24 formed peripherally along its upper sidewalls. A thin nitride liner 25 is disposed on the inner sidewalls of the oxide collar 24. This thin nitride liner 25 is an important feature of the instant invention, as will be described below.

The DRAM 20 may be formed by growing epitaxial layers on a doped semiconductor substrate 33, as is well known in the art. A buried layer 26, typically highly doped, is formed within the substrate 33 either by selective ion implantation or by epitaxial growth. Forming a buried layer in a semiconductor substrate is known in the art. For example, a lower portion of buried layer 26 may be formed within substrate 33 and an upper portion of buried layer 26 may be formed within an epitaxial layer (not shown). In any event, depth line 43 shows the separation between the buried layer 26 and the channel region 28 of the transistor 36. Also shown is drain well 23, source well 29 and gate 35, which together with channel region 28 comprise the transistor 36. DRAM 20 also includes contact region 44, doped region 81 and oxide isolation region 78. It is noted that channel region 28 also extends beneath source and drain wells 29 and 23. Channel region 28 is preferably of opposite conductivity as the buried layer 26. As a result, isolation is provided between the buried layer 26 and the source and drain regions 29 and 23. Exemplary doping conductivities are: substrate 33, p–conductivity; buried layer 26, n+; channel 28, p–; drain and source regions 33 and 29, n+; contact region 44, n+; doped region 81, p–. The transistor 36 thus formed would then be a p channel FET. In any event, the instant invention may just as readily be implemented using an n channel FET. In either case, a side effect of the vertical structure is the formation of a parasitic transistor 45 formed between buried layer 26, drain well 23 and the portion of channel region 28 between regions 23 and 26.

The trench cell 21 of capacitor 32 is formed within the buried layer 26. While trench cell 21 may be substantially cylindrical, it may also be formed with a truncated cone-like shape with the wide portion of the cone being at the top surface. The diameter of the trench cell cone would then taper down to a given diameter at a predetermined depth. Trench cell 21 may also have a square or rectangular platform. It is seen that the cross-sectional view of FIG. 2 corresponds to either a cylindrical trench or a trench with a square or rectangular platform. Whether the trench cell is substantially cylindrical or otherwise, the very bottom of the trench could be formed so that it is recessed out at the bottom to improve punchthrough characteristics.

A thin dielectric layer 22 is disposed along the bottom of the trench and peripherally along the bottom sidewalls of the trench up to a predetermined level, as indicated by depth line 39. Dielectric layer 22 may alternatively extend all the way to the top surface 89 of the DRAM 20 instead of ending at line 39 (this embodiment is omitted from FIG. 2.) This dielectric layer 22 may be silicon dioxide ($SiO_2$) such as a thermal oxide or TEOS oxide or multilayers of oxides, nitrides, and/or deoxidized nitride. If the trench cell 21 is formed with a recessed out portion (not shown) at the bottom of the trench, then the oxide layer at the trench bottom would be thicker than that along the sidewalls. This increased oxide thickness at the trench bottom is advantageous because this area is more vulnerable to punchthrough, as has been found in the prior art.

The trench 21 is filled with a first "plug" 38 of doped polysilicon to the same level as that of the thin oxide layer 22, i.e., to line 39. With transistor 36 embodied as a p channel FET, as in the above example, plug 38 is preferably doped n+. In an n channel FET embodiment, plug 38 would be doped p type and buried layer 26 would also preferably be p type. A second polysilicon plug 37, preferably of the same doping level as the first plug 38, fills the remainder of the trench cell 21. However, this second plug 37 is inserted in the trench after the thick oxide collar 24 and nitride collar 25 are formed, as will be described below.

Polysilicon plugs 38 and 37 thus form one plate of trench cell capacitor 32. Now, buried layer 26 has a portion which adjoins trench cell 21. Channel region 28 also has a portion adjoining trench cell 21. The combination of these adjoining portions of buried layer 26 and channel 28 form the other plate of capacitor 32, with the substantial contribution coming from the buried plate adjoining portion. The adjoining portion of channel 28 contributes very little to the capacitance. Thin dielectric layer 22 thus separates the plates of the capacitor 32. The thinner dielectric layer 22 is made, the higher the capacitance. However, layer 22 must be made thick enough to ensure that no dielectric breakdown will occur.

After the first polysilicon plug 38 is inserted in the trench 21, thick oxide collar 24 with nitride liner 25 is formed peripherally along the inside perimeter the trench 21 from line 39 to the top surface 89 of capacitor 32. Now, a parasitic transistor 45 is formed as follows: buried layer 26 acts as the drain, drain region 23 acts as the source, polysilicon 37 behaves as the gate, and the portion of channel region 28 between regions 23 and 26 acts as the channel region for parasitic transistor 45. Oxide collar 24 with nitride liner 25 behaves as the insulator between the gate and the channel of parasitic transistor 45. The combination of the thickness of oxide collar 24, which functions to increase the threshold voltage of the parasitic device, and the low conductivity doping of channel region 28, insures that parasitic transistor 45 is not conductive.

An additional purpose of the thick oxide collar 24 is to assure that there is no dielectric breakdown or punchthrough between polysilicon 37 and region 28. Dielectric breakdown or punchthrough would otherwise be a possibility whenever a high differential voltage is present between polysilicon 37 and the portion of channel 28 that adjoins the trench 21.

The addition of the nitride layer or "liner" 25 on the inner sidewalls of oxide isolation collar 24 affords several key advantages over a trench cell capacitor without such a nitride liner. Firstly, subsequent high temperature processing and high temperature oxidation is customarily performed after the formation of the isolation collar 24. The nitride liner 25 prevents excess oxidation of the trench-fill polysilicon (plugs 37 and 38) which would otherwise occur during the subsequent processing. Second, nitride liner 25 also prevents trench sidewall bulk silicon oxidation that would otherwise occur during the high temperature oxidation. Third, bulk silicon oxidation and excess trench-fill polysilicon oxidation would typically lead to stress induced defect generation, which is now also prevented by nitride liner 25. Fourth, nitride liner 25 functions to prevent outdiffusion of dopants from the highly doped regions 37 and 38 through "weak" regions of the isolation collar 24 into the vertical parasitic device 45. This outdiffusion would typically undesirably turn on the parasitic device 45 or cause it to exhibit leakage, problems which are now prevented by the nitride liner 25. Finally, nitride liner 25 prevents interface contamination between trench fill polysilicon plugs 38 and 37. This is accomplished by the nitride liner 25 hindering outdiffusion and outgassing of contaminants such as oxygen from the isolation collar region during trench polysilicon fill with plug 37 and associated processing.

It is noted that trench cell 21 may have another thin oxide liner (omitted from FIG. 2 for convenience) disposed peripherally on the inner sidewalls 79 of nitride liner 25, i.e., between nitride liner 25 and polysilicon plug 37. This thin oxide liner may be formed by heat treating the nitride liner 25 at a high temperature such as, for example, 900° Celcius under a steam atmosphere. With liner 25 comprised of silicon nitride, a thin layer of the inner walls of nitride liner 25 is converted to $SiO_2$ by this heat treatment to form the thin oxide liner.

Figure 3:
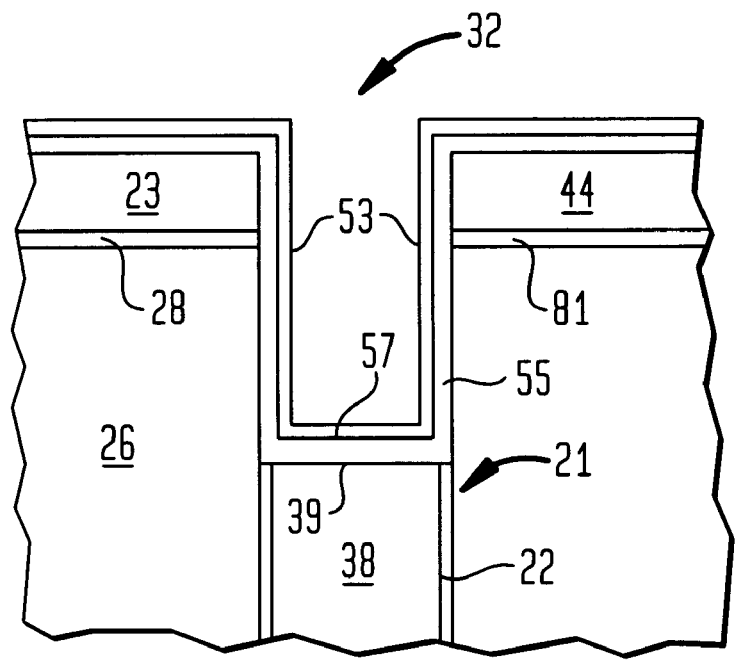
FIGS. 3–4 illustrates process steps in the manufacture of a memory cell according to the instant invention.
Figure 4:
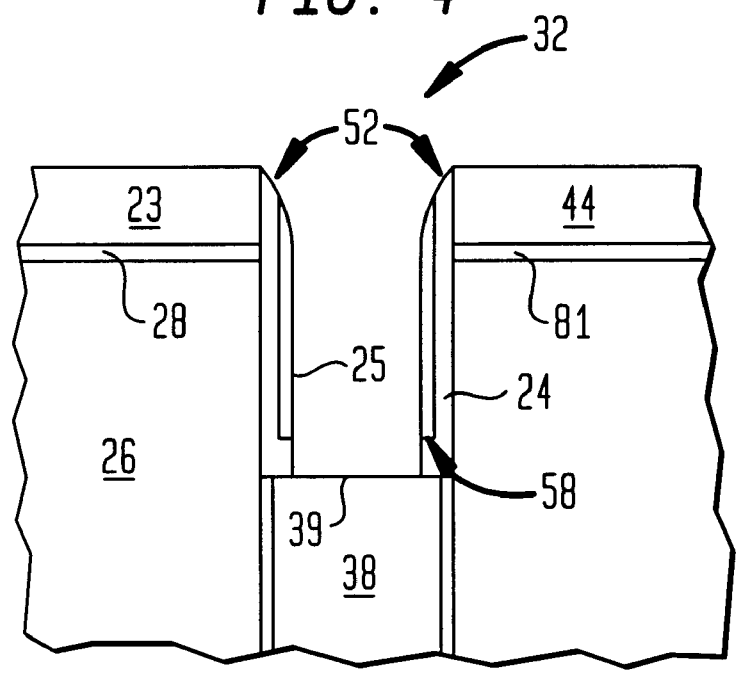

Referring now to FIGS. 3 and 4, one sequence of steps in the formation of the thick oxide collar 24 and thin nitride collar 25 is illustrated. After the thin oxide layer 22 is formed and first silicon plug 38 is formed or inserted within trench 21, a thick oxide layer 55 is formed, as shown in FIG. 3. Oxide layer 55 is formed to cover a major surface indicated by line 39, consisting of the top surfaces of first silicon plug 38 and of thin dielectric layer 22. Layer 55 extends peripherally along the upper sidewalls of trench 21 and along the top surfaces of wells 23 and 44. Thick oxide layer 55 may be a silicon dioxide which is preferably a TEOS oxide, but may also be a thermal oxide.

A thin nitride layer 57 is then deposited to cover all exposed areas of thick oxide layer 55 within trench 21 along the sidewalls and above line 39, and also to cover exposed areas above regions 23 and 44, as shown. Nitride layer 57 is preferably a silicon nitride such as $Si_3N_4$ and deposited either by low pressure chemical vapor phase deposition (LPCVD), by CVD, or by PECVD or other appropriate method. An exemplary thickness of nitride layer 55 would be in the range of 70–180 angstroms. An exemplary thickness of oxide layer 55 is preferably three to five times the thickness of the nitride layer. It is noted that thin dielectric layer 22 may be about the same thickness as the nitride layer 55, i.e., 70–180 Angstroms.

The portions of nitride layer 57 and thick oxide layer 55 disposed on the top surface of polysilicon plug 38 and within the inner sidewalls of nitride layer 56 (i.e., as indicated by boundaries 53, in cross section) are then etched away. Standard photomasking and photoetching techniques may be used as well as spacer-forming plasma etching techniques. The layers above regions 23 and 44 are also etched away. Thick oxide collar 24 with thin nitride liner 25 are thus formed, as shown in FIG. 4. Precautions must be taken during the etching process to prevent the portion of nitride layer 57 that is disposed on the inner sidewalls of oxide layer 55 from being substantially consumed. Photoetching is also used to peripherally etch back oxide layer 24 and nitride liner 25 from the top surface down, to form a peripherally tapered region 52. This allows the second polysilicon plug 37 (shown in FIG. 2), which is subsequently formed or inserted, to be situated closer to drain region 23, thereby facilitating electrical contact between the two regions. The etching back technique thus obviates the need for an additional electrode between the trench polysilicon plug 37 and drain 23 by enabling a direct electrical connection between the two regions, or, allows for the use of a physically smaller electrode.

An alternative method of forming a thick oxide collar with thin nitride liner within a DRAM trench cell capacitor according to the instant invention is illustrated in FIGS. 5–8. FIG. 5 shows a trench capacitor 70 comprising a trench cell 71 formed within a buried layer 69. The bottom portion of trench 71 is lined peripherally with a thin dielectric layer 75, and filled with a first highly doped polysilicon plug 76 up to a predetermined depth line 72. A thick oxide layer 62 such as TEOS is then formed along the upper sidewalls of trench 71, and on a major surface consisting of the top surfaces of polysilicon plug 76 and thin oxide layer 75, which is indicated by depth line 72. Oxide layer 62 is also formed to extend on the top surface of drain region 67 and doped region 63. Layer 62 is then "spacer" etched away in the region above depth line 72 such that only the thick oxide sidewalls remain, as shown in FIG. 6. The portion of thick oxide layer 62 above regions 67 and 63 are also etched away and the top portion etched back to form a peripherally tapered region 61.

Figure 7:
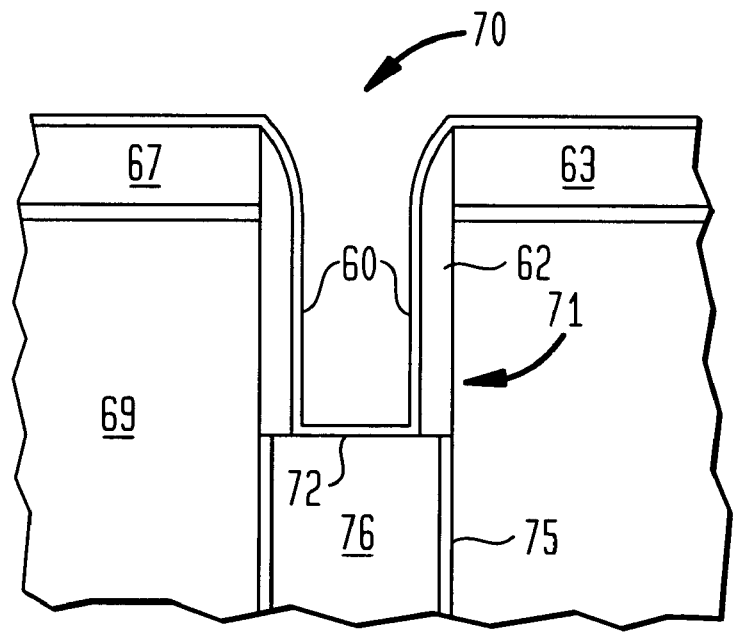

A thin nitride layer 60 is then applied within trench 71 to completely cover thick oxide layer 62, as shown in FIG. 7. An exemplary thickness of nitride layer 60 would be 70 to 180 Angstroms. Thick oxide layer 62 may be, for example, three to five times the thickness of nitride layer 60. Dielectric layer 75 is preferably about the same order of thickness of nitride layer 60. Nitride layer 60, which may be silicon nitride $Si_3N_4$ deposited by LPCVD, CVD, PECVD or other appropriate method, initially covers the top surfaces of regions 67 and 63 and the exposed surface of polysilicon plug 76, corresponding to depth line 72. The nitride layer covering these latter surfaces are then spacer etched away, resulting in the configuration of FIG. 8. A tapered nitride layer region 77 is also formed in proximity to tapered oxide region 61 via the spacer etching. This allows drain region 67 to be situated closer to a second highly doped polysilicon plug 75, which is formed or inserted within trench cell 71 as the last step in the process. Electrical contact between the two regions is thereby facilitated or may be accomplished directly.

Figure 8:
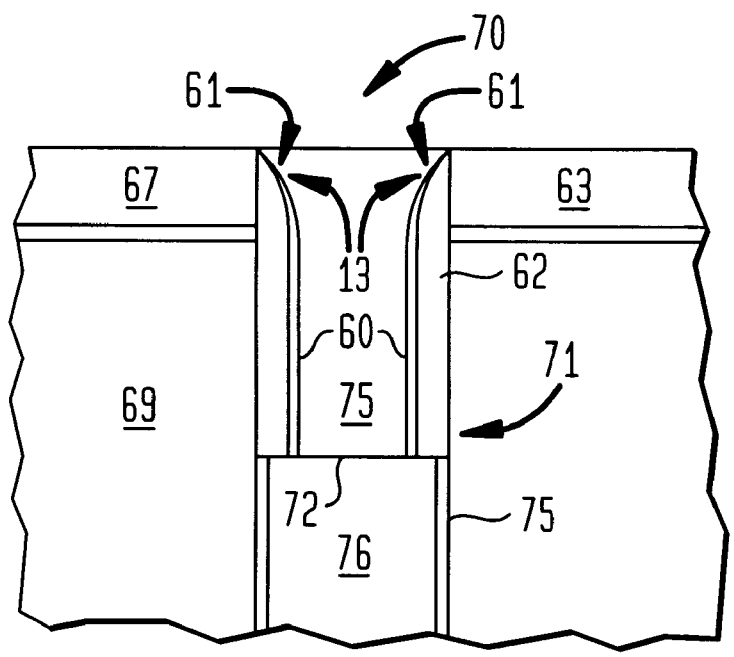

In the structure of FIG. 8, the resulting nitride liner 60 extends all the way down to the A first polysilicon plug 76 at depth line 72. This is slightly different than the structure of FIG. 4 which was the result of the first described process according to the present invention. In FIG. 4, the nitride liner 25 extends down to a depth 58 which is slightly shallower than the depth of oxide collar 24. Although the configurations of FIGS. 4 and 8 are thus distinguishable, the performance characteristics of the two different trench capacitors are substantially the same.

The alternate described process corresponding to FIGS. 5–8 has one advantage over the process of FIGS. 3–4. That is, consumption of the nitride layer 60 is more easily avoided by etching the oxide layer disposed on the major polysilicon surface in a separate step, i.e., as shown in FIG. 6. In the first described process of FIGS. 3–4, the portion of the nitride layer 57 disposed on the sidewalls of oxide layer 55, may be undesirably subjected to relatively more etching in order to etch away the oxide layer disposed on plug 38. Thus, this sidewall portion of nitride layer 57 is more easily consumed. On the other hand, the process of FIGS. 5–8 involves more steps, and hence, it is necessary for the trench capacitor designer to perform a tradeoff between the two processes.

Experimental results demonstrate the advantage of the improved trench capacitor of the present invention. An experiment was performed on product lots of 128K DRAM memory blocks having isolation collars with and without nitride liners. Results indicated a 30% wafer yield improvement for the memory blocks having the nitride liner over those that did not.

Thus disclosed is an improved trench cell capacitor suitable for use in DRAM memory cells, which has an isolation collar with a nitride liner, and, methods for producing the same. A first advantage of the capacitor according to the instant invention is that excess oxidation of trench-fill doped polysilicon is prevented during high temperative processing subsequent to isolation collar formation. Another advantage of this invention is that trench sidewall bulk silicon oxidation is prevented during high temperature oxidation. A further advantage of the present invention is that, by preventing unwanted oxidation, the generation of stress induced defects are in turn prevented. An additional advantage of this invention is that it prevents the outdiffision of dopants through "weak" collar regions into regions of a vertical parasitic device adjacent to the trench cell capacitor, which would otherwise be turned on or exhibit leakage. Yet another advantage of the instant invention is that contamination of the interface between two polysilicon "plugs" that fill the trench cell of the capacitor is prevented. The invention prevents this contamination by hindering outdiffusion and outgassing of contaminants such as oxygen from the isolation collar region during the trench poly-fill and processing that occurs after the isolation collar is formed.

A preferred embodiment of a process for fabricating an improved trench cell capacitor according to the present invention is now described. The trench cell capacitor to be described forms a part of a DRAM memory cell. The following description is taken in good part from parent application Ser. No. 08/715,289 ('289) while the foregoing description was taken from parent application Ser. No. 08/726,442. The reference numerals that follow are consistent with the '289 parent application but not the preceding discussion.

Figure 9:
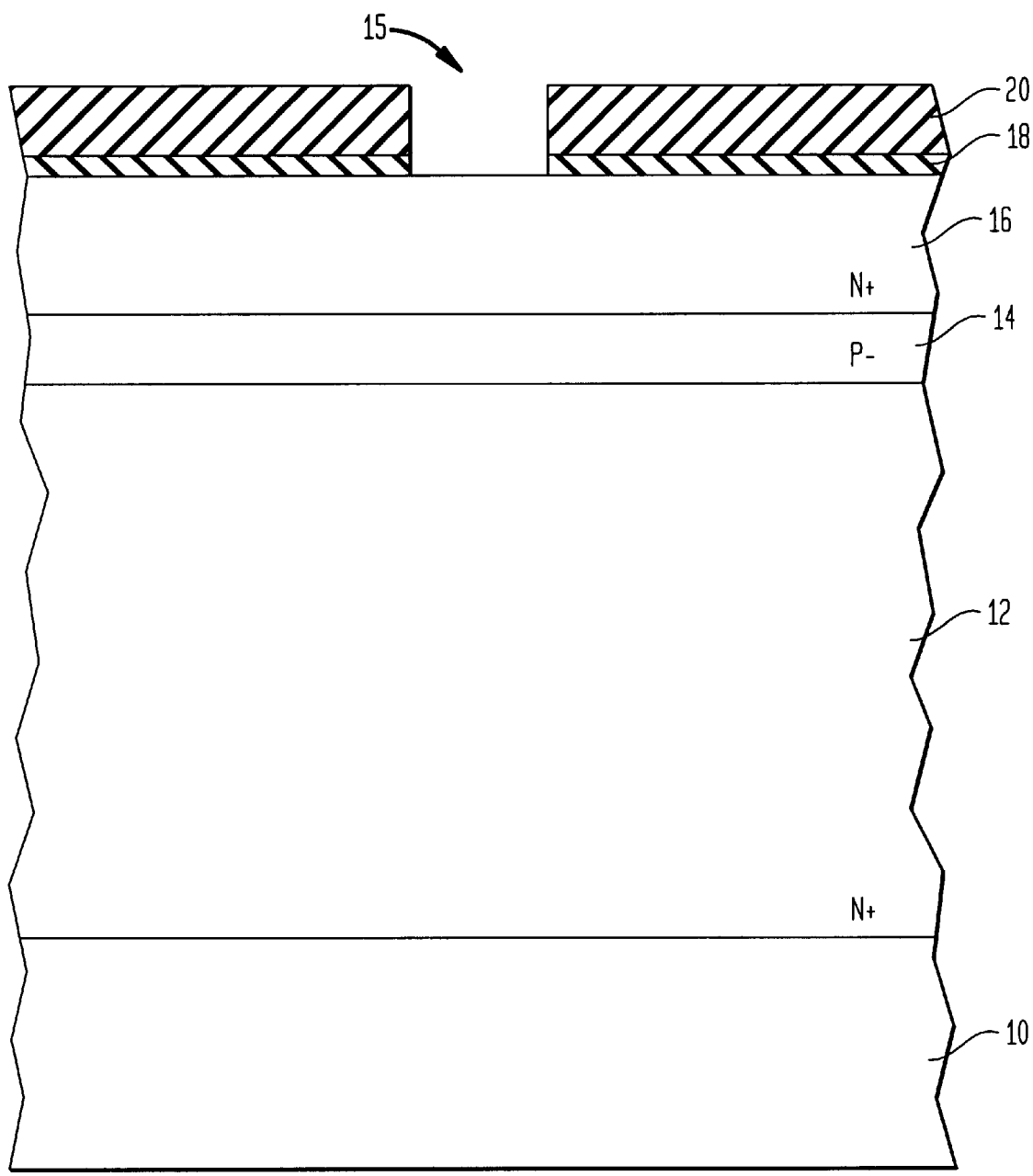
FIG. 9 shows an initial process step in forming the improved trench cell capacitor within a semiconductor substrate according to the present invention.

Referring to FIG. 9, a buried layer 12 is formed within a silicon substrate 10 and doped to a N+ impurity concentration. Buried layer 12 may be formed via selective ion implantation, epitaxial growth or a combination of both, as is commonly known in the art. This buried layer 12 will constitute one of the plates of the trench cell capacitor. Atop the buried layer 12, silicon layers 14 and 16 are epitaxially grown and doped P− and N+, respectively. It should be understood that opposite conductivities to those illustrated may be employed, as is known by those skilled in the art. Layers 14 and 16 form the channel and drain regions, respectively of an FET (not shown) which transfers logic level voltages to the trench capacitor to be formed. An oxide layer 18 and silicon nitride layer 20 are then sequentially deposited on the top surface of the structure, which layers are patterned via a conventional etching method to form an opening 15 that exposes the top surface of the drain region 16. The oxide layer 18 may be either tetra-ethyl-orthosilicate (TEOS), or silicon dioxide formed by thermal oxidation. Silicon nitride layer 20 may be $Si_3N_4$ deposited using LPCVD or plasma enhanced chemical vapor deposition (PECVD). Exemplary thicknesses for the layers are 50–100 nm for the oxide layer 18, and about 300 nm for the silicon nitride layer 20. Layers 18 and 20 serve as a hard mask for the formation of a trench within the opening 15. The silicon nitride layer 20 acts as an oxidation barrier to protect the top surface of the device during trench sidewall oxidation (to be described below).

Figure 10A:
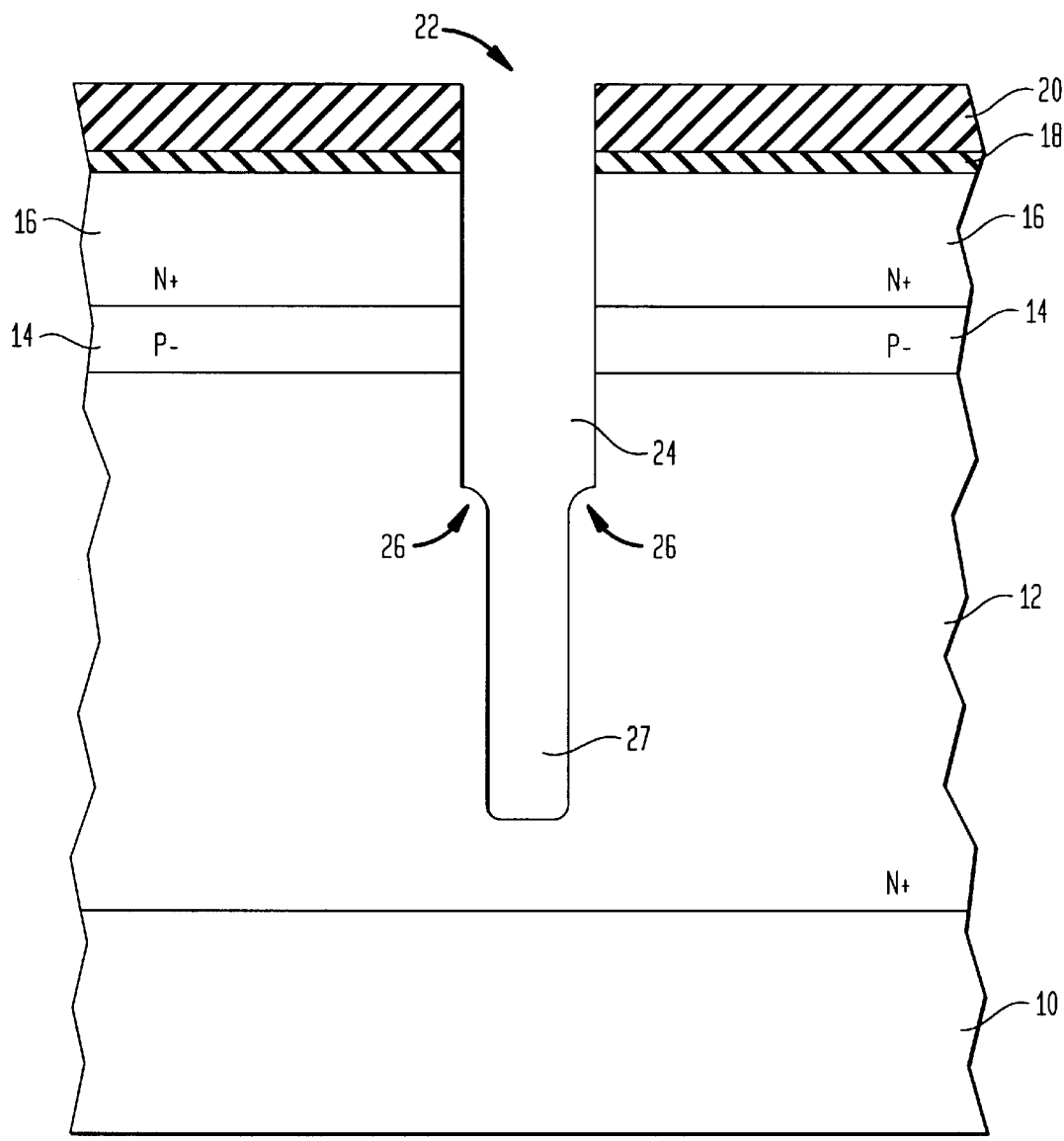
FIGS. 10A and 10B show cross-sectional and plan views, respectively, of a trench formed within the semiconductor substrate of FIG. 9.
Figure 10B:
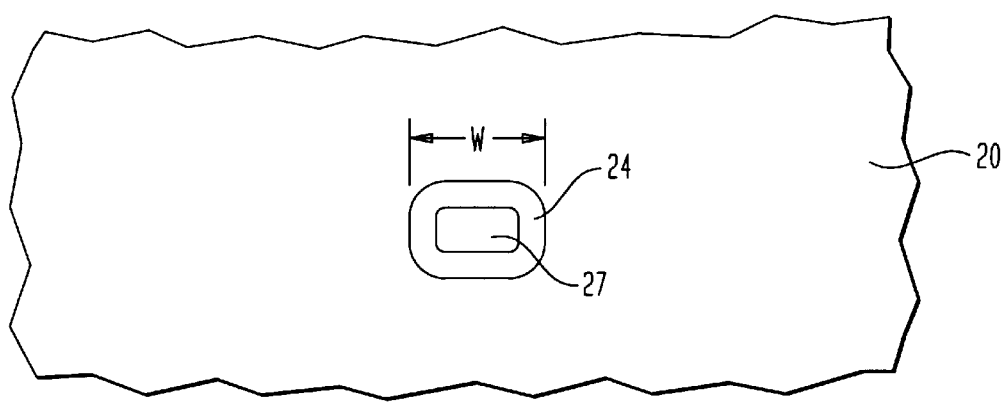

Next, the exposed silicon in the opening 15 is reactively ion etched in an atmosphere containing $SF_6$, $Cl_2$ and He to form a deep trench 22 as shown in FIGS. 10A and 10B. Other suitable atmospheres may alternatively be employed in the etching process. Trench 22 is thus formed by etching through the epitaxial layers 16 and 14 and through a substantial portion of the buried layer 12. The trench 22 has an exemplary depth of five microns, and an exemplary width W of 250–500 nm. Peripheral shoulders 26 define a lower portion 27 and upper portion 24 of the trench 22, where lower portion 27 has a smaller width than that of the upper portion 24. As shown in the plan view of FIG. 10B, the trench 22 may have a rectangular platform; however, the trench platform geometry may be tailored as desired for a particular application. Preferably, the trench 22 is formed with substantially vertical sidewalls.

Figure 11:
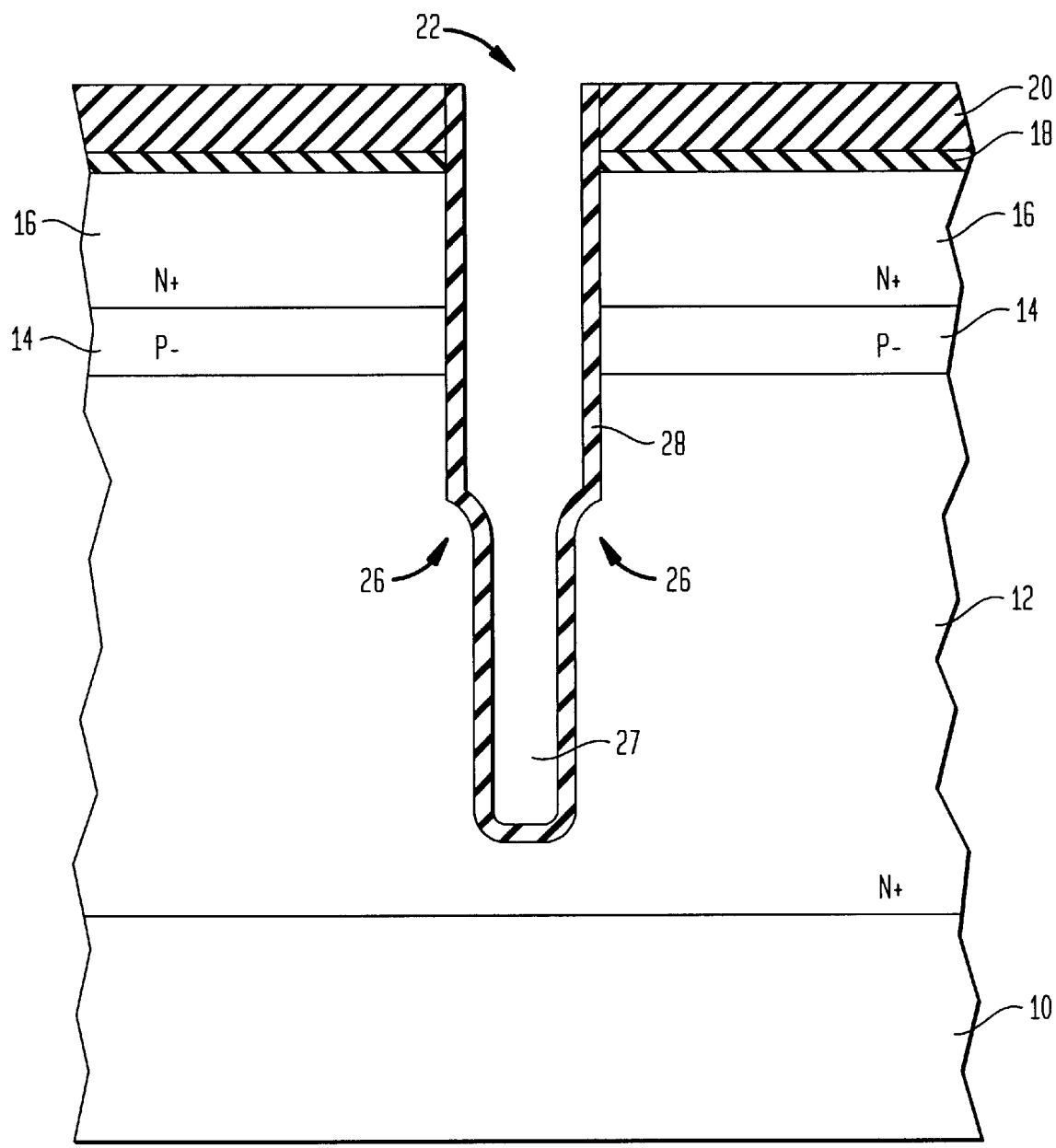
FIG. 11 depicts a cross-sectional view of a thin dielectric layer peripherally formed within the trench of FIGS. 10A and 10B.

Referring now to FIG. 11, a thin dielectric layer 28 is then formed along the sidewalls and bottom of the trench 22. Dielectric layer 28 preferably has a thickness in the range of 10–50 nm, and is composed of silicon dioxide formed by thermal oxidation. Alternatively, dielectric layer 28 may be composed of a three layer oxide/nitride/oxide sandwich. In any case, the layer 28 serves as the dielectric separating the two plates of the trench capacitor. The thinner that layer 28 is made, the higher the capacitance, as is commonly known. The thickness of layer 28 at the bottom of the trench may be greater than along the sidewalls in order to reduce the possibility of punch-through at the bottom of the trench.

Figure 12:
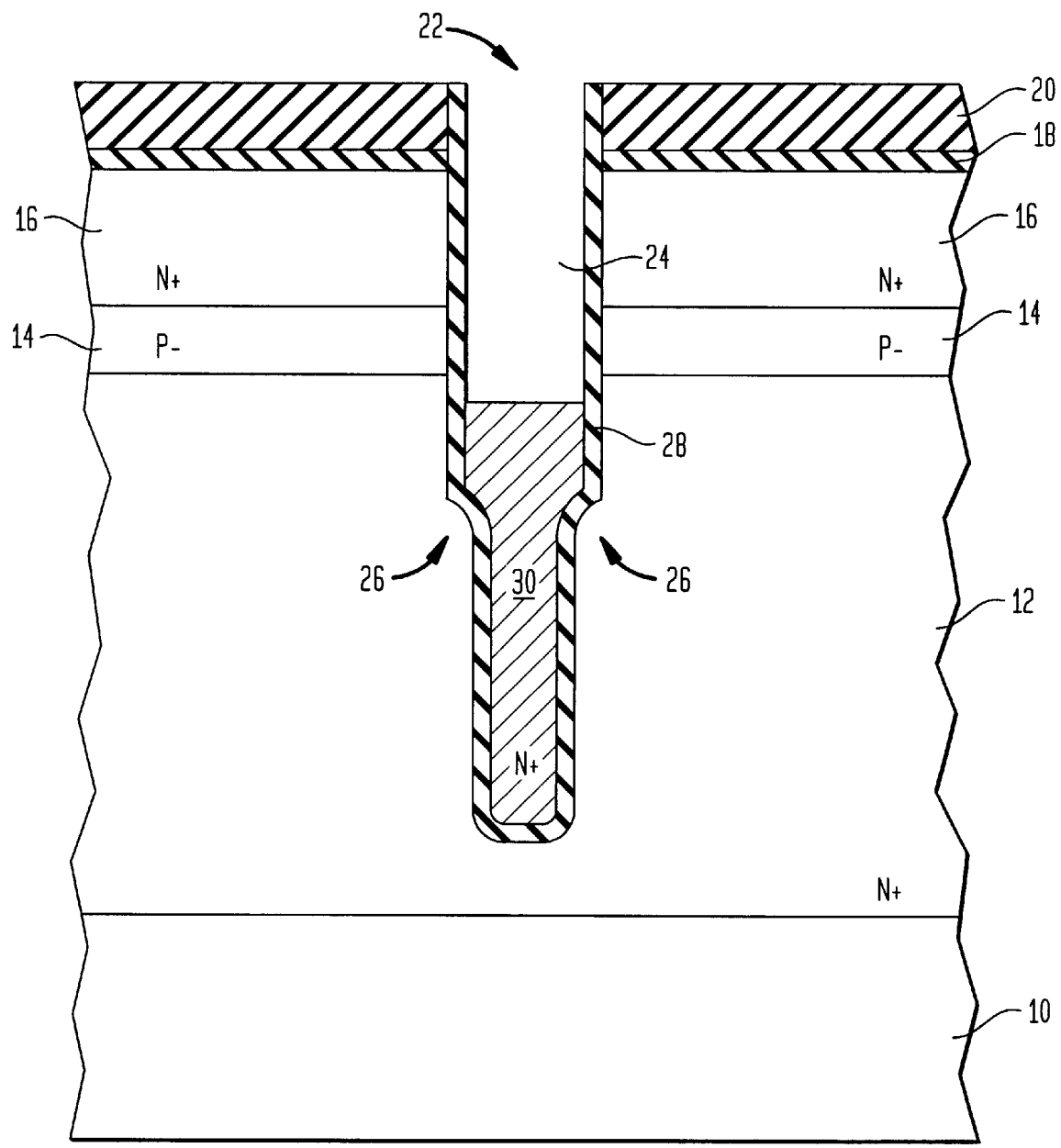
FIG. 12 illustrates a first polysilicon fill plug deposited within the trench of FIG. 11.

Turning now to FIG. 12, a first polysilicon "fill" plug 30 is formed by directional LPCVD to completely fill the lower portion 27 and a part of the upper portion 24 of the trench 22. Directional LPCVD is used with an ion beam impinging the device structure at normal incidence. This allows the trench to be filled with polysilicon essentially from the bottom up, without polysilicon being deposited on the upper sidewalls of the trench. A low temperature of less than about 750° C. is used in this process. An example of a suitable apparatus for such directional LPCVD is found in U.S. Pat. No. 5,290,358 entitled "Apparatus for Directional Low Pressure Chemical Vapor Depositor (DLPCVD)".

The fill plug 30 is highly doped with arsenic to provide a N+ impurity concentration in the illustrative embodiment. The doping of the fill plug 30 can be accomplished either during the LPCVD, or in a subsequent step via ion implantation. Polysilicon fill 30 thus forms the second plate of the trench capacitor—the first plate consists of the buried layer 12 in the immediate vicinity of the lower portion of the trench 22. In the case where the buried layer 12 is doped to a P+ impurity concentration, the fill plug 30 will of course also be doped P+ using a suitable doping agent such as boron. Fill 30 extends up from the bottom of the trench, above the trench shoulders 26, to a depth level of approximately one to two microns below the top surface of the silicon layer 16—thus, it has a vertical length of about three to four microns.

Figure 13A:
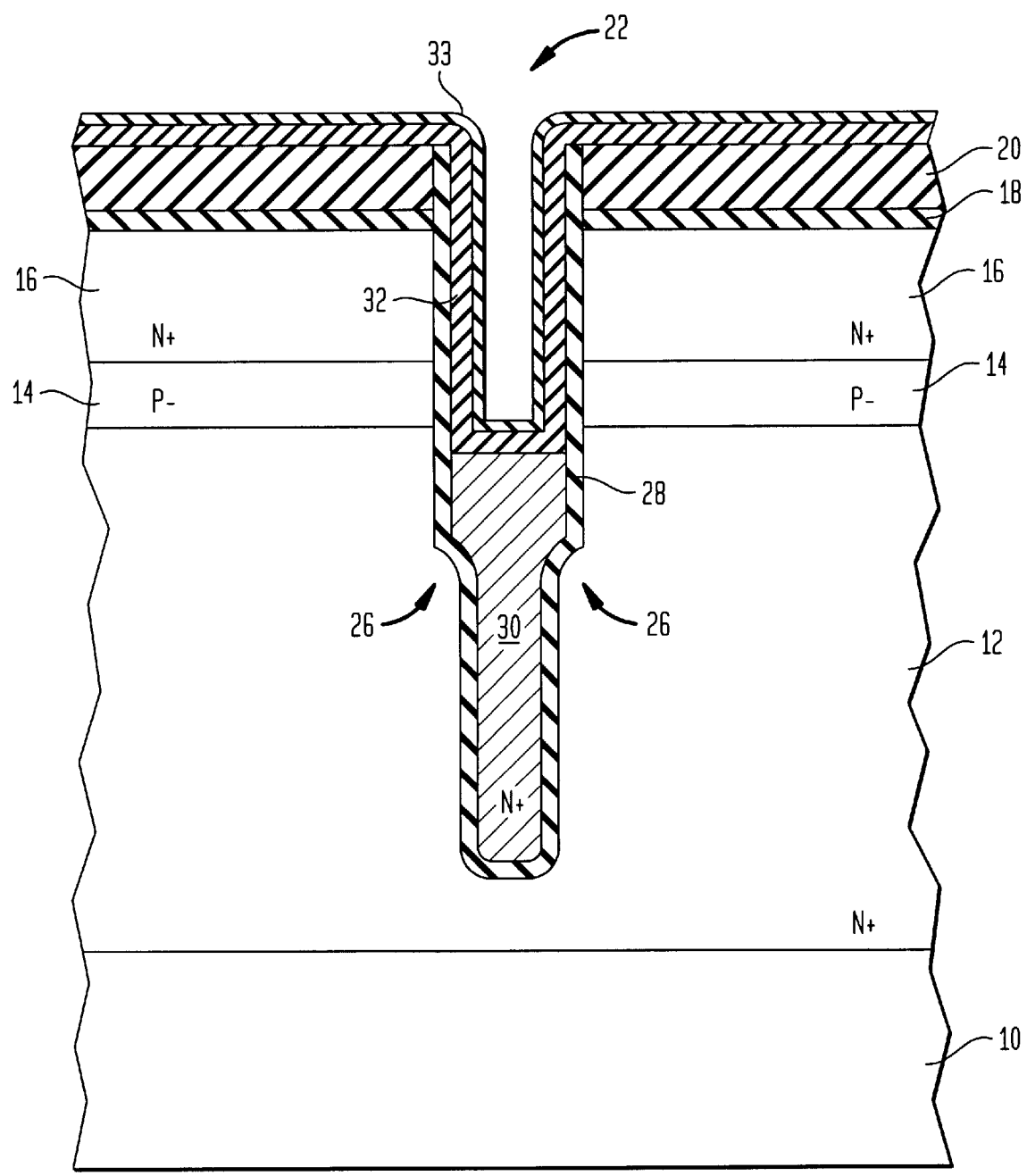
FIGS. 13A and 13B illustrate formation of an isolation collar within the trench of FIG. 12.

Following the deposition of the first polysilicon fill plug 30, a thick oxide layer 32 composed of TEOS or silicon dioxide, is formed peripherally around the remaining sidewalls of the trench 22, and on the top surface of the fill plug 30, as shown in FIG. 13A. The oxide layer 32 extends over the top of the trench 22 to overlay the nitride layer 20. An exemplary thickness for this layer 32 is in the range of 50–100 nm. On the oxide layer 32, a 5–20 nm thick silicon nitride layer 33 such as $Si_3N_4$ is deposited using, for example, LPCVD, CVD or PECVD. Thus, the total thickness of an isolation "collar" consisting of dielectric layer 28 together with oxide layer 32 and nitride layer 33, is in the range of about 65–170 nm (assuming a thickness range of 10–50 nm for dielectric layer 28). The addition of the nitride layer 33 affords several advantages. These include preventing excessive oxidation of the doped polysilicon within the trench during subsequent high temperature processing; and preventing outdiffusion of dopants through weak collar regions into regions of the vertical parasitic device adjacent to the trench cell capacitor, which would otherwise be turned on or exhibit leakage. Despite the aforementioned advantages, it should be understood that the additional nitride layer 33 may be eliminated if so desired, to reduce the complexity of the overall process.

Figure 13B:
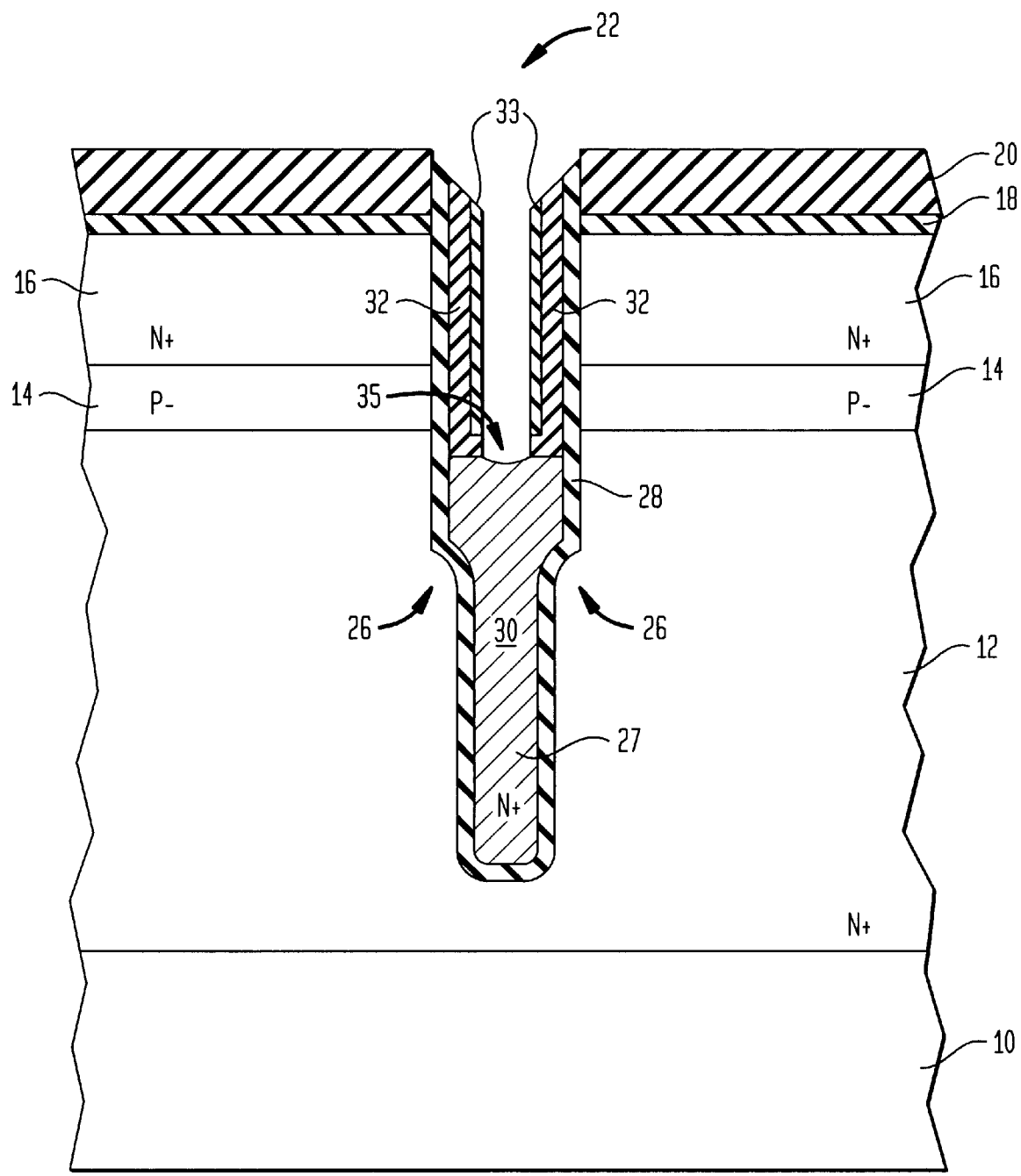

The bottom portions of oxide layer 32 and nitride layer 33 in the center of the trench are then etched away to expose the top portion of the polysilicon fill plug 30 as is shown in FIG. 13B. The portions of layers 32 and 33 overlaying the nitride layer 20 are also etched away at this time. A directional etch such as reactive ion etch (RIE) is preferably employed. During this process step, a small recess 35 is intentionally formed in the fill plug 30, which serves as a foundation for the polysilicon epitaxial growth to be described. Precautions must be taken in the etching step to prevent the nitride layer 33 on the sidewalls from being substantially consumed. Whether or not the nitride layer 33 is utilized, this etching of the bottom portion of the isolation collar often consumes some of the isolation collar sidewalls, resulting in a tapered trench. In the prior art CVD processes, the integrity of the polysilicon fill within the upper portion of the trench is highly dependent upon the trench shape and thus, the etching process has to be closely controlled to keep the shape within a narrow tolerance window. The selective epitaxial growth of the trench polysilicon to be described is relatively independent of trench shape. This allows for a broader process window for the preceding isolation collar etching step.

Figure 14:
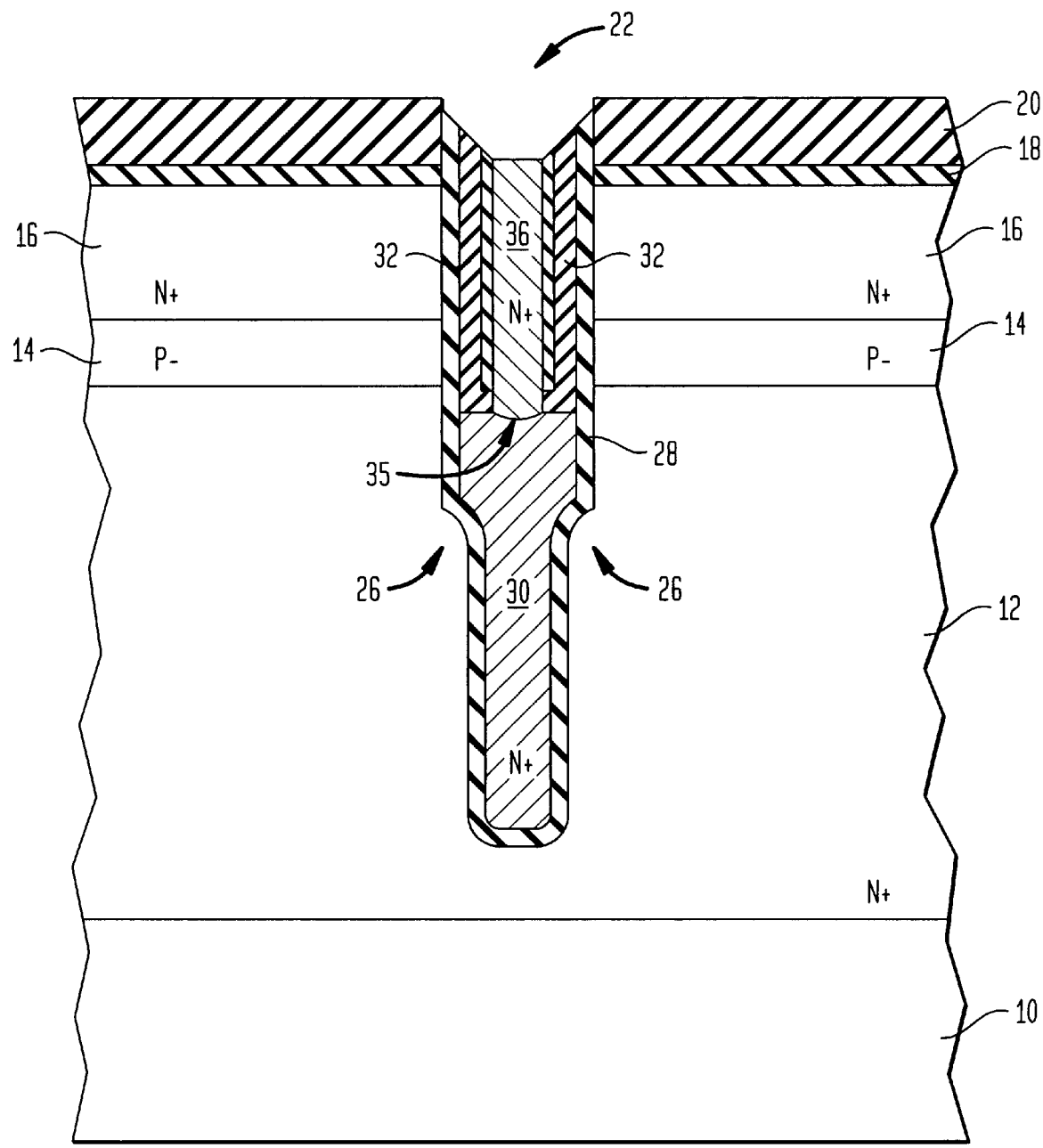
FIG. 14 shows a second polysilicon fill plug epitaxially grown within the trench of FIG. 13B.

Following the etching of the bottom portions of layers 32 and 33, a second polysilicon fill plug 36, shown in FIG. 14, is grown on the first fill plug 30 by means of selective epitaxial growth. This epitaxial growth of the second fill 36 is a key aspect of the present invention.

The selective epitaxial growth occurs from the bottom up, i.e., from the recess of the first fill 30 to the top portion of the oxide layer 32, resulting in a void free polysilicon fill.

The polysilicon fill 36 is doped to a N+ impurity level either by using in-situ doped selective epitaxy or by using intrinsic selective epitaxy followed by an ion implantation step. The doping agent is preferably arsenic to achieve this N+ doping concentration. In the case where the first polysilicon fill 30 is doped P+, the second fill 36 will of course also be doped P+.

The selective epitaxial growth process for forming the second fill plug 36 replaces prior art processes which utilized LPCVD. A variety of problems with the LPCVD process are obviated with the selective epitaxial growth. These include the problems of voids and seams resulting from the LPCVD which lead to conductive stringers and residues formed during subsequent gate electrode patterning.

The polysilicon is epitaxially grown in the trench to form the fill plug 36 by using a gas-solid or heterogeneous reaction system. The heterogeneous reaction system preferably employs a combination of gases including $H_2$, $SiCl_4$, HCl and a dopant gas containing arsenic to provide a N+ doping level. (When a P+ doping concentration is desired, a dopant gas containing boron is used). In an alternate technique, the dopant gas may be excluded and the fill plug 36 doped to the desired impurity level using selective ion implantation with appropriate masking after the epitaxial growth is complete. In this latter case, the ion implantation can be tailored to dope the first polysilicon fill plug 30 at the same time, provided that the fill plug 30 was not already doped, of course.

In order to provide a rapid filling of the trench 22, the epitaxial growth process is performed at a temperature within the range of about 900–1100° C. Since the portion of the trench 22 to be filled via epitaxial growth is deep—typically between 1.0–2.0 microns—this rapid filling of the trench is highly desirable. The epitaxial growth occurs vertically to a level protruding above the top surface of silicon layer 16, as shown. Also, the device is subjected to the high ambient temperature for at least several minutes prior to the epitaxial growth in a pre-bake step. This pre-bake enhances the integrity of the interface between the fill 30 and the fill 36 at the recess 35. A low contact resistance is thus provided at that interface.

Figure 15:
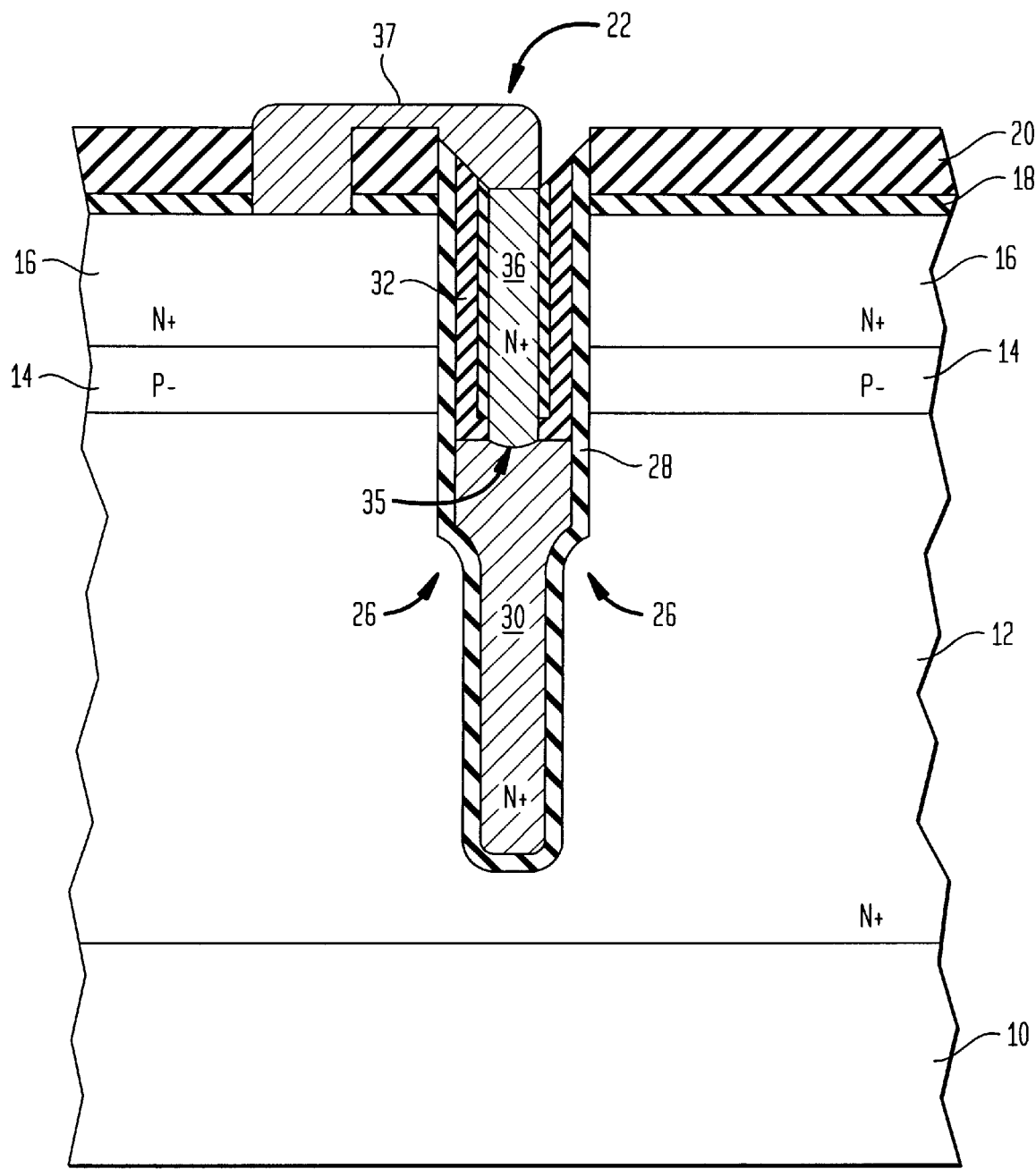
FIG. 15 depicts an electrode formed between the trench cell capacitor of FIG. 14 and a well region of the memory cell transistor.

In subsequent steps, the hard mask layers 20 and 18 are selectively etched to expose a portion of the well region 16. As shown in FIG. 15, a contact electrode 37 is then formed using suitable metallization to interconnect the top surface of the polysilicon fill plug 36 and the exposed surface of the well region 16. Such contact electrode formation is well known in the art.

Thus disclosed is an improved process for fabricating a trench cell capacitor which utilizes selective epitaxial growth to form the top polysilicon fill layer within the trench. The process according to the invention results in an improved trench cell capacitor with less voids and seams in the trench polysilicon as compared to trench capacitors fabricated using the CVD processes of the prior art. Residue and stringer formation problems during subsequent gate electrode patterning are eliminated with the present invention. In addition, the softer and void free surfaces of the epitaxially grown trench polysilicon enhances the robustness of the memory cell, allowing a broader process window for subsequent oxidations. The process of the present invention is also simpler than the prior art inasmuch as it eliminates the need for trench polysilicon and isolation collar annealing, chemical mechanical polishing (CMP), cleans, and trench fill recess steps. Moreover, the risk of thinning the oxide/nitride hard mask during CMP is eliminated. Finally, a broader process window for the trench etching is provided because the epitaxially grown trench polysilicon is highly robust independent of the trench shape.

It should be understood that the embodiments described herein are merely exemplary and that a person skilled in the art may make many variations and modifications without departing from the spirit and scope of the invention. All such modifications are intended to be included within the scope of the invention as defined by the appended claims.

We claim:

1. A method of fabricating a trench cell capacitor within a semiconductor body, the method comprising:

forming a trench within a semiconductor substrate, wherein the trench comprises upper and lower portions;

lining the trench with a dielectric layer;

after lining the trench, forming a collar in an upper portion of the trench by forming an oxide layer in the upper portion of the trench and a silicon nitride layer on the oxide layer; and filling said trench with conductive material to substantially fill said trench, the silicon nitride layer and oxide layer of the collar electrically isolating the conductive material from a sidewall portion of the trench.

2. The method of claim 1 and further comprising filling the lower portion of the trench with a conductive material before forming the collar.

3. The method of claim 2 wherein filling the lower portion of the trench comprises filling the lower portion of the trench with polysilicon.

4. The method of claim 1 and further comprising subjecting the silicon nitride layer to a heat treatment in the presence of steam such that an exposed surface of said silicon nitride layer is converted to a second oxide layer.

5. The method of claim 1 wherein the oxide layer is deposited within the trench on exposed walls of the trench and on an exposed major surface within the trench and the silicon nitride layer is deposited on exposed portions of the oxide layer.

6. The method of claim 5 and further comprising etching away a portion of the silicon nitride layer and a portion of the oxide layer disposed on the major surface to expose a portion of the major surface.

7. The method of claim 6 and further comprising etching away a top portion of the oxide layer and of the silicon nitride layer, the top portion of the oxide layer being disposed on the walls of the trench, wherein the oxide layer and the silicon nitride layer are tapered as a function of depth such that the top portion of the oxide layer has a thickness that is less than a remaining portion of the oxide layer and such that the top portion of the silicon nitride layer has a thickness that is less than a remaining portion of the silicon nitride layer.

8. The method of claim 1 and further comprising prior to forming the collar:

lining the lower portion of the trench with a dielectric layer after the trench is formed within the semiconductor substrate, the dielectric layer serving as the node dielectric of the trench capacitor; and providing the trench with doped semiconductor material in the lower portion thereof.

9. The method of claim 1 wherein:

the oxide layer is deposited on exposed walls of the upper portion of the trench and on an exposed major surface within the trench;

a portion of the oxide layer covering the major surface is etched away to expose a portion of the major surface;

the silicon nitride layer is deposited within the trench over exposed portions of the oxide layer and over exposed portions of the major surface; and a portion of the silicon nitride layer deposited on the major surface is etched away to again expose a portion of the major surface.

10. The method of claim 1 wherein:

the oxide layer is deposited on exposed walls of the upper portion of the trench and on an exposed major surface within the trench;

the silicon nitride layer is deposited within the trench over exposed portions of the oxide layer; and portions of the oxide layer and the silicon nitride layer deposited on the major surface is etched away to expose a portion of the major surface.

11. The method of claim 1 wherein the silicon nitride layer is $Si_3N_4$ deposited by chemical vapor deposition.

12. The method of claim 1 wherein the trench capacitor is formed as part of a dynamic random access memory cell.

13. The method of claim 1 wherein filling the trench comprises epitaxially growing a semiconductor material in the upper portion of the trench.

14. A method of fabricating a trench cell capacitor within a semiconductor body, the method comprising:

forming a trench within a semiconductor substrate, wherein the trench comprises upper and lower portions;

forming a dielectric layer upon a surface of both the upper and lower portions of the trench;

filling the lower portion of the trench with a conductive material;

forming a collar in the upper portion of the trench, the collar comprising an oxide layer and a silicon nitride layer; and without removing the silicon nitride layer, filling the upper portion of the trench with a conductive material.

15. The method of claim 14 wherein the step of forming a collar comprises:

depositing the oxide layer on a surface of the upper portion of the trench;

depositing the silicon nitride layer on the oxide layer; and subjecting the silicon nitride layer to a heat treatment in the presence of steam such that an exposed surface of said silicon nitride layer is converted to a second oxide layer.

16. The method of claim 14 wherein the step of forming a collar comprises:

depositing the oxide layer on a surface of the upper portion of the trench; and depositing the silicon nitride layer on the oxide layer;

wherein a portion of the oxide layer is removed prior to depositing the silicon nitride layer, the portion of the oxide layer being disposed over the conductive material in the lower portion of the trench.

17. The method of claim 14 wherein the step of forming a collar comprises:

depositing the oxide layer on a surface of the upper portion of the trench; and depositing the silicon nitride layer on the oxide layer;

wherein a portion of the oxide layer is removed after depositing the silicon nitride layer, the portion of the oxide layer being disposed over the conductive material in the lower portion of the trench.

18. The method of claim 14 wherein the steps of filling the lower portion and the upper portion of the trench both comprise filling the trench with a doped semiconductor material.

19. The method of claim 14 wherein filling the upper portion of the trench with a conductive material comprises epitaxially growing a semiconductor material in the upper portion of the trench.

20. A method of forming a trench capacitor, the method comprising:

forming a trench in a semiconductor region, the trench including upper and lower portions;

lining the upper and lower portions of the trench with a dielectric material;

filling the lower portion of the trench with a conductive material;

forming an oxide layer over the semiconductor region, surfaces of the dielectric layer on the upper portion of the trench and exposed portions of the conductive material in the lower portion of the trench;

anisotropically etching the oxide layer to remove portions of the oxide layer over the semiconductor region and over the conductive material in the lower portion of the trench;

forming a silicon nitride layer over the semiconductor region, the oxide layer on the upper portion of the trench, and exposed portions of the conductive material in the lower portion of the trench;

anisotropically etching the silicon nitride layer to remove portions of the silicon nitride layer over the semiconductor region and over the conductive material in the lower portion of the trench; and filling the upper portion of the trench with a conductive material.

21. The method of claim 20 wherein filling the upper portion of the trench with a conductive material comprises epitaxially growing a semiconductor material in the upper portion of the trench.

22. The method of claim 20 and further comprising the step of forming a second oxide layer over the silicon nitride layer prior to anisotropically etching the silicon nitride layer.

23. The method of claim 22 wherein the second oxide layer is formed by subjecting the silicon nitride layer to a heat treatment in the presence of steam.

24. The method of claim 20 and further comprising subjecting the silicon nitride layer to a heat treatment in the presence of steam such that an exposed surface of the silicon nitride layer is converted to a second oxide layer.

25. The method of claim 20 wherein:

filling the lower portion of the trench comprises filling the lower portion of the trench with a doped semiconductor material; and filling the upper portion of the trench comprises filling the upper portion of the trench with a doped semiconductor material.

26. In a process for fabricating a trench cell capacitor having a trench penetrating a doped buried layer within a semiconductor body, said doped buried layer forming a first plate of said capacitor, said trench having a lower portion filled with doped semiconductor material to partially form a second plate of said capacitor, and a peripheral dielectric layer separating said first capacitor plate and said second partially formed capacitor plate, the improvement therewith comprising the steps of:

forming an isolation collar in a top portion of said trench, said isolation collar comprising a layer of silicon nitride deposited over a layer of oxide; and filling said top portion of said trench in a region surrounded by said silicon nitride and oxide isolation collar with a conductive material.

27. The process of claim 26 wherein filling said top portion of said trench comprises epitaxially growing semiconductor material to complete said second plate of said capacitor.

28. A process for fabricating a trench cell capacitor within a silicon substrate, comprising the steps of:
  forming a doped buried layer within said silicon substrate to provide a first plate of said capacitor;
  forming a trench within said silicon substrate to a depth level penetrating the buried layer;
  depositing a dielectric layer peripherally within said trench;
  filling a lower portion of said trench with doped polysilicon to partially form a second plate of said capacitor, wherein said first plate and second partially formed plate are separated by said dielectric layer;
  forming an isolation collar peripherally within an upper portion of said trench, said isolation collar comprising a layer of silicon nitride deposited over a layer of oxide; and
  forming polysilicon material over said silicon nitride and oxide isolation collar, said polysilicon completing said second plate of said capacitor.

29. The process of claim 28 wherein forming polysilicon material within said isolation collar comprises epitaxially growing silicon within said isolation collar.

30. The method of claim 1 wherein filling the trench with a conductive material comprises filling the trench with a semiconductor material.

31. The method of claim 30 wherein the conductive material comprises a polysilicon plug.

32. The method of claim 20 wherein forming a silicon nitride layer comprises depositing a silicon nitride layer directly on the oxide layer.

33. The method of claim 20 wherein the conductive material comprises a polysilicon plug.

34. The method of claim 20 wherein the silicon nitride layer and the oxide layer of the collar electrically isolate the conductive material from a sidewall portion of the trench.

* * * * *

UNITED STATES PATENT AND TRADEMARK OFFICE
CERTIFICATE OF CORRECTION

PATENT NO.    : 6,207,494 B1                                                        Page 1 of 1
DATED         : March 27, 2001
INVENTOR(S)   : Graimann et al.

It is certified that error appears in the above-identified patent and that said Letters Patent is hereby corrected as shown below:

<u>Title page,</u>
Item [60], Related U.S. Application Data, should read as follows:
-- Continuation-in-part of application No. 08/726,442, filed on Oct. 4, 1996, now abandoned, which is a division of application No. 08/413,644, filed on Mar. 30, 1995, now abandoned, and is also a continuation-in-part of application No. 08/715,289, filed on Sept. 16, 1996, now abandoned, which is a continuation of application No. 08/365,649, filed on Dec. 29, 1994, now Pat. No. 5,677,219. --

Signed and Sealed this

Twenty-fourth Day of September, 2002

*Attest:*

*Attesting Officer*

JAMES E. ROGAN
*Director of the United States Patent and Trademark Office*